United States Patent [19]
Yamanobe et al.

[11] Patent Number: 6,165,607
[45] Date of Patent: Dec. 26, 2000

[54] SPUTTERING TARGET AND ANTIFERROMAGNETIC FILM AND MAGNETO-RESISTANCE EFFECT ELEMENT FORMED BY USING THE SAME

[75] Inventors: Takashi Yamanobe, Machida; Naomi Fujioka, Zama; Takashi Ishigami; Nobuo Katsui, both of Yokohama; Hiromi Fuke, Kawasaki; Kazuhiro Saito, Yokohama; Hitoshi Iwasaki, Yokosuka; Masashi Sahashi; Takashi Watanabe, both of Yokohama, all of Japan

[73] Assignee: Kabushiki Kaisha Toshiba, Kawasaki, Japan

[21] Appl. No.: 09/101,455

[22] PCT Filed: Nov. 20, 1997

[86] PCT No.: PCT/JP97/04232

§ 371 Date: Jul. 17, 1998

§ 102(e) Date: Jul. 17, 1998

[87] PCT Pub. No.: WO98/22636

PCT Pub. Date: May 28, 1998

[30] Foreign Application Priority Data

Nov. 20, 1996 [JP] Japan ................................. 8-308816

[51] Int. Cl.[7] ........................................................ G11B 5/66
[52] U.S. Cl. ........................... 428/332; 428/336; 428/692; 428/694 R; 428/694 T; 428/694 TM; 428/900; 427/128; 427/129; 427/130; 360/113; 204/192.2; 148/314
[58] Field of Search ................................. 428/694 R, 692, 428/694 T, 900, 332, 336; 427/128–130; 204/192.2; 360/113; 148/314

[56] References Cited

U.S. PATENT DOCUMENTS 4,103,315  7/1978  Hempstead et al. .................... 360/110
4,836,865  6/1989  Sakakima et al. ....................... 148/306
5,014,147  5/1991  Parkin et al. ....................... 360/327.32
5,049,209  9/1991  Sakakima et al. ....................... 148/306
5,315,468  5/1994  Lin et al. ............................ 360/327.32

FOREIGN PATENT DOCUMENTS

| 0 167 118 | 1/1986 | European Pat. Off. . |
| 0 167 118 A2 | 1/1986 | European Pat. Off. . |
| 37 07 522 | 9/1987 | Germany . |
| 63-21298 | 1/1988 | Japan . |
| 64-17205 | 1/1989 | Japan . |
| 1-118238 | 5/1989 | Japan . |
| 2-109309 | 4/1990 | Japan . |
| 3-271359 | 12/1991 | Japan . |

*Primary Examiner*—Leszek Kiliman
*Attorney, Agent, or Firm*—Foley & Lardner

[57] ABSTRACT

A sputtering target consisting essentially of Mn and at least one kind of R element selected from a group of Ni, Pd, Pt, Co, Rh, Ir, V, Nb, Ta, Cu, Ag, Au, Ru, Os, Cr, Mo, W, and Re. The sputtering target, at least as a part of target texture, comprises one member selected from a group of an alloy phase and a compound phase formed between the R element and Mn. In addition, oxygen content in the target is 1 weight % or less (including 0). With such a sputtering target, an anti-ferromagnetic material film consisting of RMn alloy excellent in corrosion resistivity and thermal performance can be stabilized in its film composition and film quality. By employing the anti-ferromagnetic material film, when an exchange coupling film is formed by stacking the anti-ferromagnetic material film and the ferromagnetic material film, sufficient exchange coupling force is obtained stably. Such an exchange coupling film can be used in a magneto-resistance effect element and the like.

56 Claims, 7 Drawing Sheets

SPUTTERING TARGET AND ANTIFERROMAGNETIC FILM AND MAGNETO-RESISTANCE EFFECT ELEMENT FORMED BY USING THE SAME

TECHNICAL FIELD

This invention relates to a sputtering target, an anti-ferromagnetic material film formed using thereof and a magneto-resistance effect element formed using the same.

BACKGROUND ART

Until now, as a reproducing magnetic head for high density magnetic recording, a magnetic head (MR head) using a magneto-resistance effect element (hereinafter referred to as MR element) is under study. At present time, for a magneto-resistance effect film (MR film), $Ni_{80}Fe_{20}$ (atomic %) alloy (permalloy) or the like, which shows anisotropic magneto-resistance effect (AMR), is generally used. Since the AMR film possesses such a small magneto-resistance change rate as about 3% (MR change rate), as an alternative material for the magneto-resistance effect film material, an artificial lattice film and a spin valve film such as (Co/Cu)n and the like, which display giant magneto-resistance effect (GMR), are attracting attention.

In an MR element using an AMR film, since the AMR film possesses magnetic domains, Barkhausen noise resulting from the existence of the magnetic domains becomes a drawback when putting to practical use. Therefore, various means for making an AMR film into a single domain are being studied. As one method among them, there is a method in which the magnetic domains in an AMR film is controlled in one particular direction by utilizing exchange coupling between an AMR film, which is a ferromagnetic material, and an anti-ferromagnetic material film. As an anti-ferromagnetic material in this case, γ-FeMn alloy is so far well known (see the specification of U.S. Pat. No. 4,103,315, the specification of U.S. Pat. No. 5,014,147, and the specification of U.S. Pat. No. 5,315,468, for example).

Besides, a spin valve film comprises a sandwich film possessing a laminate structure formed of a ferromagnetic layer/a non-magnetic layer/a ferromagnetic layer, and, by pinning magnetization of one ferromagnetic layer, a GMR is obtained. For pinning magnetization of another ferromagnetic layer of the spin valve film, a technology utilizing exchange coupling between an anti-ferromagnetic film and a ferromagnetic film is generally used. For a constituent material of the anti-ferromagnetic material film in this case, γ-FeMn alloy is generally in use.

However, γ-FeMn alloy is poor in corrosion resistivity. In particular, it is easily corroded by water. Thus, since an MR element utilizing an anti-ferromagnetic material film consisting of γ-FeMn alloy is easily corroded by, particularly, water in the air during processing step into an element shape or a head shape, thus, as a result of this corrosion, the exchange coupling force with an MR film tends to gradually deteriorate in time.

For an exchange coupling film formed between an anti-ferromagnetic material film and a ferromagnetic material film, from reliability view-point, an exchange coupling force is required to be 200 Oe and more at, for example, 393 K. To realize an exchange coupling force of 200 Oe and more at 393 K, in addition to an exchange coupling force at room temperature, temperature dependency of the exchange coupling force is required to be good. Concerning the temperature dependency of the exchange coupling force, a blocking temperature at which temperature the exchange coupling force between a ferromagnetic material film and an anti-ferromagnetic material film is lost is desirable to be high as much as possible. However, γ-FeMn alloy is as low as 443 K in the blocking temperature, and also the temperature dependency of the exchange coupling force thereof is very poor.

Besides, in U.S. Pat. No. 5315468 for example, θ-Mn alloy, such as NiMn alloy, possessing a crystal structure of face-centered tetragonal crystal system is described as an anti-ferromagnetic material film. When an anti-ferromagnetic material film consisting of the θ-Mn alloy is used, it is shown that the exchange coupling force between the anti-ferromagnetic material film and the ferromagnetic material film does not deteriorate.

Further, as an anti-ferromagnetic material film high in a blocking temperature, large in an exchange coupling force, and excellent in corrosion resistivity, IrMn alloy possessing a crystal structure of face-centered tetragonal crystal system is proposed. As anti-ferromagnetic material films possessing the same crystal structure, γ-Mn alloy such as PtMn alloy or RhMn alloy other than γ-FeMn alloy is known (see U.S. Pat. No. 4,103,315, U.S. Pat. No. 5,315,468).

As described above, Mn alloys such as IrMn alloy, PtMn alloy, RhMn alloy, NiMn alloy, PdMn alloy, and CrMn alloy are excellent in corrosion resistivity and further can be enhanced in the blocking temperature of the exchange coupling film. Thus, they are attracting attention as an anti-ferromagnetic material capable of enhancing long term reliability of the MR element.

Now, as a method for forming an anti-ferromagnetic material film, the sputtering method is generally used. Using a sputtering target comprising each element which constitutes the above described Mn alloys, an anti-ferromagnetic material film is formed into a film by a sputtering method. However, an anti-ferromagnetic material film formed into a film with a conventional sputtering target tends to form a nonhomogeneous film composition in a formed film plane. In such an exchange coupling film formed between an anti-ferromagnetic material film and a ferromagnetic material film, there is a problem that a sufficient exchange coupling force can not be obtained. In addition, there is another problem that an MR element and an MR head which use such an exchange coupling film tend to be adversely affected on the anti-ferromagnetic material film from the other constituent films to deteriorate in its exchange coupling performance.

Further, the conventional sputtering target tends to cause a large composition deviation between film composition sputtered at the initial stage of sputtering and that obtained at the life end. Such a temporal change of the film composition of the anti-ferromagnetic material film can also cause to deteriorate the exchange coupling performance.

The first object of the present invention is to stabilize a film composition and a film quality of an anti-ferromagnetic material film comprising a Mn alloy excellent in corrosion resistivity and thermal property, and to provide a sputtering target less in the composition deviation up to the life end. The second object of the present invention is to provide a sputtering target capable of forming with reproducibility an anti-ferromagnetic material film of which exchange coupling force at the room temperature and high temperature region is stable, and to provide an anti-ferromagnetic material film possessing such performance. The third object of the present invention is, by using an anti-ferromagnetic material film excellent in such performance, to provide a magneto-resistance effect element which enables to obtain stable performance and stable output power with reproducibility.

DISCLOSURE OF INVENTION

The first sputtering target of the present invention consists essentially of Mn and at least one kind R element selected from a group of Ni, Pd, Pt, Co, Rh, Ir, V, Nb, Ta, Cu, Ag, Au, Ru, Os, Cr, Mo, W, and Re, wherein the sputtering target comprises at least one member selected from a group of an alloy phase and a compound phase formed between the above described R element and Mn as at least a part of the target texture.

The second sputtering target of the present invention consists essentially of Mn and at least one R element selected from a group of Ni, Pd, Pt, Co, Rh, Ir, V, Nb, Ta, Cu, Ag, Au, Ru, Os, Cr, Mo, W, and Re, wherein, the sputtering target, as at least a part of target texture, includes at least one member selected from a group of an alloy phase and a compound phase formed between the R elements and Mn, and oxygen content thereof is 1 weight % or less (including 0).

The first and second sputtering target are further featured in Mn other than that constituting the alloy phase and the compound phase possessing a grain diameter of 50 μm and less.

The third sputtering target of the present invention consists essentially of Mn and at least one kind of R element selected from a group of Ni, Pd, Pt, Co, Rh, Ir, V, Nb, Ta, Cu, Ag, Au, Ru, Os, Cr, Mo, W, and Re, oxygen content thereof being 1 weight % or less (includes 0).

In a sputtering target of the present invention, it is further preferable that carbon content is 0.3 weight % or less (includes 0) and its relative density is 90% or more. The sputtering target of the present invention comprises, for example, 30 atomic % or more of Mn. The sputtering target of the present invention can further comprise at least one element selected from a group of Be, Ti, Zr, Hf, Zn, Cd, Al, Ga, In, Si, Ge, Sn, and N.

An anti-ferromagnetic material film of the present invention is formed in a film by sputtering the above described sputtering target of the present invention.

The magneto-resistance effect element of the present invention is featured in comprising an above-described anti-ferromagnetic material film of the present invention. The magneto-resistance effect element of the present invention comprises, for example, the above described anti-ferromagnetic material film of the present invention and a ferromagnetic material film exchange coupled with the anti-ferromagnetic material film. Further, the magneto-resistance effect element comprises the above described anti-ferromagnetic material film of the present invention, a first ferromagnetic layer exchange coupled to the anti-ferromagnetic material film, and a second ferromagnetic layer stacked with the first ferromagnetic layer through a non-magnetic layer. The magneto-resistance effect element of the present invention can be applied in, for example, a magnetic head. The magneto-resistance effect element of the present invention can be used in a magnetic recording apparatus such as a MRAM, and a magnetic sensor.

In the present invention, the R element is distributed in a sputtering target as an alloy phase or a compound phase formed between Mn. By distributing the R element in a target texture as the alloy phase or the compound phase formed with Mn, a composition within the target can be made homogeneous. Further, the target texture can also be made to approach a homogeneous state. In particular, when a total composition of a target is rich in Mn, by distributing the R element as the alloy phase or the compound phase formed between Mn, the composition and the texture can be enhanced in homogeneity.

Further, by controlling oxygen content in a sputtering target to be 1 weight % or less, even when the sputtering target possesses a target composition rich in Mn, high densification thereof can be easily attained. Reduction of the oxygen content of the sputtering target and densification thereof largely contribute in purifying and in making low the oxygen content of an anti-ferromagnetic material film formed therewith. Further, they contribute in enhancement of film quality and film composition (deviation from the target composition) of the anti-ferromagnetic material film.

By forming a sputtering film of an anti-ferromagnetic material by sputtering the above described sputtering target of the present invention, an anti-ferromagnetic material film excellent in homogeneity within its film plane can be obtained stably. Further, by homogenizing the composition and the texture of the sputtering target, the composition can be effectively suppressed in deviation from the initial stage of the sputtering target to the life end thereof. The reduction of the oxygen content of the sputtering target and high densification thereof can have the same effect.

As described above, by using the sputtering target of the present invention, an anti-ferromagnetic material film excellent in stability of the film composition as well as in homogeneity of the film composition within its film plane can be obtained with reproducibility. By forming an exchange coupling film through lamination of such an anti-ferromagnetic material film with, for example, a ferromagnetic material film, performance excellent in sufficient exchange coupling force, good corrosion resistivity, heat resistivity, and the like can be obtained stably.

MODE FOR CARRYING OUT THE INVENTION

Figure 1:
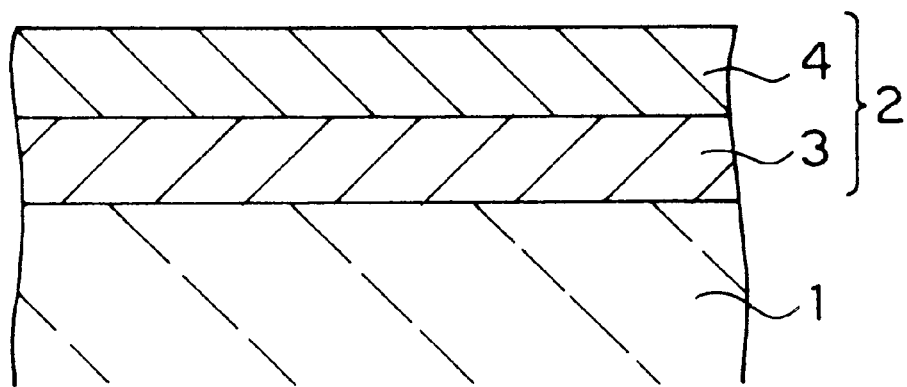
FIG. 1 is a cross sectional view showing a structure of one example of an exchange coupling film using an anti-ferromagnetic material film of the present invention.

Embodiments for implementing the present invention will be described in the following.

As a first example of a sputtering target of the present invention, one consisting substantially Mn and at least one R element selected from a group of Ni, Pd, Pt, Co, Rh, Ir, V, Nb, Ta, Cu, Ag, Au, Ru, Os, Cr, Mo, W, and Re, can be cited. An anti-ferromagnetic material film comprising RMn alloy formed in a film using a sputtering target of the present invention can, by laminating it with various ferromagnetic material films, be used as, for example, an exchange coupling film.

In a sputtering target of the present invention, although Mn content can be appropriately set based on a combination with the R element, Mn content is preferable to be set at least at 10 atomic % or more. When the Mn content is too low, excellent exchange coupling force can not be obtained. On the contrary, when the content of the R element is too low, corrosion resistivity tends to deteriorate. Thus, Mn content is preferable to be set in the range of from 10 to 98 atomic %. The present invention is particularly effective for a sputtering target comprising a composition rich in Mn, such as 30 atomic % or more of the Mn content.

A more preferable range of the Mn content is set based on a selected R element. For example, when the R element is Ir, Rh, Au, Ag, Co, Ru, Re, it is preferable for the Mn content to be set in the range of from 40 to 98 atomic %, and more preferable to be set in the range of from 60 to 95 atomic %. An RMn alloy including above described R element generally stabilizes in a crystal structure of a face-centered cubic crystal system in the above described composition range. Since an RMn alloy comprising a face-centered cubic crystal structure portion as a part thereof possesses a particularly high Neel temperature (the temperature where an anti-ferromagnetic material loses its anti-ferromagnetism), a blocking temperature of an exchange coupling film can be much improved.

In addition, when the R element is Ni, Pd, thermal stability can be enhanced when the crystal structure takes a face-centered tetragonal crystal system. Therefore, it is preferable for the Mn content to be set in such a composition range where the crystal structure stabilizes, namely 30 to 70 atomic % of Mn content. When the R element is Cr, the RMn alloy takes a body-centered cubic crystal structure and a body-centered tetragonal crystal structure, and the Mn content is preferable to be set in the range of from 30 to 70 atomic %. When the R element is Pt, both a face-centered cubic crystal structure and a face-centered tetragonal crystal structure can be excellent in thermal stability. In this case, the Mn content is preferable to be in the range of from 30 to 98%, and more preferable to be in the range of from 60 to 95%.

A sputtering target of the present invention can include, other than the above described R elements, at least one kind of element (A element) selected from a group of Be, Ti, Zr, Hf, Zn, Cd, Al, Ga, In, Si, Ge, Sn and N. Although an anti-ferromagnetic material film composed of an RMn alloy can, based on the above described composition range and the crystal structure, show an excellent corrosion resistivity compared with conventional FeMn alloy, by including such additional components, the corrosion resistivity can be furthermore enhanced. However, if the A element is added too much, the exchange coupling force tends to deteriorate. Compounding quantity of the A element is preferable to be set at 40 atomic % or less, more preferable to be set at 30 atomic % or less.

A sputtering target of the present invention comprises, at least as a part of target texture, at least one member selected from a group of an alloy phase formed between the R element and Mn and a compound phase formed therebetween.

A sputtering target obtained by combining the R element and Mn is generally difficult in densifying it with a powder sintering method and the like, further more difficult in uniformly distributing the R element against Mn. When Mn rich composition range is employed, the distribution of the R element particularly tends to deviate from homogeneity.

In such a combination between the R element and Mn, the R element of the present invention is distributed in a sputtering target as an alloy phase or a compound phase formed between Mn. When, for example, Ir is employed as the R element, $IrMn_3$ can be cited as a compound phase therebetween. By distributing the R element into the target texture as an alloy phase or a compound phase rich in Mn and thereby reducing the R element existing in a single phase down to the minimum level, a composition among the target can be made homogeneous. Further, the target texture (metallurgical texture) also approaches to a homogeneous state. In particular, when the whole composition of the target is rich in Mn, by distributing the R element as an alloy phase or a compound phase formed therebetween, homogeneity in the composition and the texture can be improved.

Now, when two kinds or more of element are used as the R element, an alloy phase and a compound phase formed between the R elements and Mn can be any alloys or compounds formed either between respective R element and Mn, or between two kinds or more of R element and Mn. For example, when Ir and Rh are selected as the R element, any one or more of binary alloys or binary compounds formed between Ir and Mn, Rh and Mn, and tertiary alloys and tertially compounds formed between Ir and Rh and Mn can exist.

In addition, Mn other than that forming the above described alloy phase and compound phase can exist as a single phase of Mn. In the present invention, although a part of the R element can be allowed to exist as a single phase, a proportion thereof is, from above described reasons, preferable to be suppressed as small as possible.

Further, other remaining Mn than that forms the above described alloy phase and compound phase is preferable to possesses a grain diameter (grain size) of 50 $\mu$m or less. When a diameter of Mn grain remaining in a single phase is large, it can be said that Mn is segregated from a microscopic view point. To remove nonhomogeneity of the composition and the texture caused by such a segregation of Mn, Mn grain existing in a single phase is preferable to possess the maximum diameter of 50 $\mu$m or less. In addition, an average diameter of Mn grain is preferable to be in the range of from 10 to 40 $\mu$m.

Making Mn grain diameter fine is particularly effective when a target composition is Mn rich. However, since oxygen content may increase if the average diameter of Mn grain is too small, it is preferable to set the average diameter at 10 $\mu$m or more. It is more preferable to set the maximum diameter of Mn grain at 30 $\mu$m or less. Here, the grain diameter (grain size) of Mn means a diameter of the minimum circle surrounding Mn grain.

By forming an anti-ferromagnetic material film using the above described sputtering target of the present invention, the anti-ferromagnetic material film excellent in homogeneity of film composition in a film plane can be obtained stably. Making homogeneous the composition of the sputtering target and the texture thereof is also effective in suppressing composition deviation from the initial stage of sputtering to the life-end. As described above, by employing the sputtering target of the present invention, an anti-ferromagnetic material film excellent in stability of the film composition can be obtained with reproducibility. The obtained anti-ferromagnetic material film is further excellent in homogeneity of the film composition in a film plane.

A sputtering target of the present invention is further preferable to include 1 weight % or less (including 0) of oxygen in the sputtering target. When the oxygen content of the target is too large, composition control of Mn particularly during sintering becomes difficult and also the oxygen content of the anti-ferromagnetic material film formed by a sputtering filming method can increase. These may cause deterioration of performance of the anti-ferromagnetic material film. Further, if the oxygen content is large in the target, densification of the target becomes difficult. Further, in addition to bad processability, the target tends to cause crack during sputtering. More preferable oxygen content is 0.7 weight % or less, 0.1 weight % or less is more preferable.

Further, if a carbon content in a target is too large, defect such as crack tends to occur during sintering and plastic forming. In addition, such performance as an exchange coupling magnetic field and a blocking temperature of the obtained anti-ferromagnetic material film deteriorates. Therefore, the carbon content in the target is preferable to be set at 0.3 weight % or less (including 0). More preferable carbon content is 0.2 weight % or less, and 0.01 weight % is further preferable.

In particular, by reducing the oxygen content and carbon content in a sputtering target, even if the target composition is rich in Mn, the target can be densified easily. Further, making the sputtering target low in oxygen content and low in carbon content contributes in enhancing high purification, film quality, and film composition (deviation from the target composition) of the anti-ferromagnetic material film formed in a film using the sputtering target. These can improve such performance as an exchange coupling magnetic field of the anti-ferromagnetic material film and a blocking temperature thereof.

A density of the sputtering target of the present invention is preferable to be 90% or more based on the relative density of the sputtering target. If the density of the sputtering target is too low, particles tend to occur during sputtering due to irregular discharge at defective portions. If the particles is dispersed in the anti-ferromagnetic material film, in addition to deterioration of the performance, yield can also be decreased. More preferable relative density is 95% or more.

In addition, in the sputtering target of the present invention, by satisfying anyone among constitution in which a part of the target composition is formed in the alloy phase or compound phase, and constitution in which the oxygen content is reduced to 1 weight % or less, at least desired effects can be obtained. However, it is particularly preferable to satisfy both of these constitutions.

For manufacturing the sputtering target of the present invention, both of a sintering method and a melting method can be applied. However, when considered manufacturing cost and raw material yield, it is preferable to employ the sintering method.

When applying the sintering method in manufacturing of the sputtering target of the present invention, firstly, for obtaining the above described target texture (metallurgical texture which comprises alloy phase and compound phase), raw material powder as fine as possible (respective raw material powder of the R elements and Mn) is preferable to be employed. For example, by employing the R element powder, such as fine Ir powder, and fine Mn powder, homogeneous mixture state can be obtained prior to sintering and reaction between the R elements and Mn can be enhanced. These contribute for increasing production quantity of the alloy phase and compound phase formed between the R elements and Mn during sintering. Further, it is effective in making fine the grain diameter of Mn remaining as a single phase.

However, when the particle diameters of the respective raw material powder of the R elements and Mn are too small, the oxygen content in the raw material stage increases to cause increase of the oxygen content in the target. In particular, since Mn tends to absorb oxygen, it is desirable to set the particle diameter considering this. Considering these, it is preferable to set average particle diameters of the raw material powder of the R elements in the range of from 20 to 50 $\mu$m. Besides, average particle diameter of Mn raw material powder is preferable to be set at 100 $\mu$m or less, particularly preferable to be set in the range of from 40 to 50 $\mu$m.

Next, the raw material powders of the above described R elements and Mn are compounded at a predetermined proportion, and are fully mixed. For executing mixing operation of the raw material powders, various types of known mixing method such as ball mill, V-mixer can be employed. In this case, it is important to set mixing condition so as to avoid contamination from metal impurities as well as to avoid the increase of oxygen quantity. Concerning the oxygen in the raw material powder, in order to further reduce it, a small quantity of carbon can be employed as a deoxydizing agent. However, since carbon itself can cause performance deterioration in a film form anti-ferromagnetic material film, as described above, it is preferable to set the condition that the carbon content in the target is at 0.3 weight % or less.

For example, when ball milling is employed, in order to avoid contamination from metal impurities, a container and balls composed of resin (Nylon, for example) or an inside lining by friendly material such as same material with the raw material powder are preferable to be employed. In particular, it is preferable to employ material identical in quality with the raw material powder. Further, during mixing, to prevent adsorption or absorption, by the raw material powder, of gas components confined in the container from occurring, the inside of the mixing container is preferable to be a vacuum atmosphere or an atmosphere replaced by an inert gas. When a mixing method other than the ball milling method is employed, the identical preventive methods to avoid the contamination from the impurities are preferable to be implemented.

The mixing duration is appropriately set according to the mixing method, input powder quantity, mixing container capacity, and the like. If the mixing duration is too short, homogeneously mixed powder may not be obtained. On the contrary, if the mixing duration is too long, the impurity quantity tends to increase. Thus, the mixing duration is appropriately determined considering these. For example, when mixing operation is executed with the ball milling method under a condition of a mixing container of 10 liter capacity and 5 kg of inputted powder, the mixing duration is appropriate to be set at around 48 hours.

Next, a target raw material is obtained by sintering the mixed powder between the raw material powder of the above described R elements and the raw material powder of Mn. The sintering is preferable to be executed with a hot-press method or a HIP method thereby a sintered body of high density can be obtained. Although the sintering temperature is determined according to the type of the raw material powder, to enhance the reaction particularly between the R elements and Mn, it is preferable to be set in the range of from 1,150 to 1,200° C. which is immediately below the melting temperature of Mn (1,244° C.). By sintering the mixed powder under at such a high temperature, quantity of the alloy phase or the compound phase formed between the R elements and Mn can be increased in the sputtering target. That is, the R elements existing in a single phase can be reduced. The pressure during hot-pressing and HIPping is preferable to be set at 20 MPa or more thereunder the sintered body can be made dense.

The obtained target raw material is mechanically processed into a predetermined shape. By bonding this to a backing plate with, for example, a low melting solder, a sputtering target of the present invention can be obtained.

By employing such a sintering method that satisfies the above described conditions, at lower manufacturing cost than a melting method later described, a sputtering target, in which the alloy phase or the compound phase between the R elements and Mn exist and the oxygen content and the carbon content are reduced, can be manufactured stably. In addition, there is another advantage that, when the sintering method is used, yield of rare metal raw material is higher than when the melting method is employed.

When a sputtering target of the present invention is produced by employing a melting method, at first, mixed raw material obtained by mixing the R elements and Mn at a predetermined proportion is melted. For melting the mixed raw material, a conventional induction type electric furnace can be employed. When melting operation is executed with an induction method, in order to enhance volatilization of the impurities, it is preferable to be melted under a reduced pressure (in a vacuum atmosphere). However, when composition variation due to the volatilization of Mn and the like is desired to be suppressed, the melting in an inert gas atmosphere can be implemented. Further, depending on the shape of the raw material, an arc melting method or an electron beam melting method can be applicable.

An ingot obtained with the above described melting method is, after plastic forming for example, mechanically processed into a predetermined target shape. By bonding this to a backing plate with a low melting solder, a sputtering target of the present invention can be obtained. By employing the melting method as well, as identical with the above described sintering method, a sputtering target, in which the alloy phase or the compound phase formed between the R elements and Mn exist and both of the oxygen content and the carbon content are reduced, can be produced.

An anti-ferromagnetic material film of the present invention can be, by employing the above described sputtering target of the present invention, formed into a film by a conventional sputtering method. The anti-ferromagnetic material film formed by using the sputtering target of the present invention is excellent, as described above, in stability of the film composition and in the homogeneity of the film composition in the film plane as well. When it is used as an exchange coupling film by stacking it with a ferromagnetic material film, such an anti-ferromagnetic material film is formed excellent in performance such as sufficient exchange coupling force, good corrosion resistivity, and good thermal resistance with stability.

An anti-ferromagnetic material film of the present invention can be used as an exchange coupling film by stacking, for example, with a ferromagnetic material film. FIG. 1 is a diagram showing schematically one example of an exchange coupling film obtained employing an anti-ferromagnetic material film of the present invention. An exchange coupling film 2 formed on a substrate 1 comprises a stacked film of an anti-ferromagnetic material film 3 and a ferromagnetic material film 4. The stacked film can be formed in such a manner that the anti-ferromagnetic material film 3 and the ferromagnetic material film 4 are at least partially stacked to cause exchange coupling therebetween.

In addition, if a condition causing an exchange coupling is satisfied, a third layer can be interposed between the anti-ferromagnetic material film 3 and the ferromagnetic material film 4. Further, an order for stacking the anti-ferromagnetic material film 3 and the ferromagnetic material film 4 can be determined according to usage, and the anti-ferromagnetic material film 3 can be formed as an upper side. An exchange coupling material film can be formed by stacking a plurality of the anti-ferromagnetic material films 3 and the ferromagnetic material films 4.

A film thickness of the anti-ferromagnetic material film 3 consisting of RMn alloy (or RMnA alloy) is, not limited to a particular value if it is in the range causing anti-ferromagnetism, in order to obtain a large exchange coupling force, preferable to be set at a thickness thicker than that of the ferromagnetic material film 4. When the anti-ferromagnetic material film 3 is stacked above the ferromagnetic material film 4, from a view point of stability of the exchange coupling force and the like after heat treatment, the thickness thereof is preferable to be in the range of from 3 to 15 nm, and more preferable to be set at 10 nm or less. In addition, the thickness of the ferromagnetic material film 4 is, from the identical view point, preferable to be in the range of from 1 to 3 nm. On the contrary, when the anti-ferromagnetic material film 3 is stacked underneath the ferromagnetic material film 4, the thickness of the ferromagnetic material film 3 is preferable to be in the range of from 3 to 50 nm, and that of the ferromagnetic material film 4 is preferable to be in the range of from 1 to 7 nm.

For the ferromagnetic material film 4, a ferromagnetic layer of various types of single layer structures composed of Fe, Co, Ni, or alloys therebetween, a magnetic multiple layer film and a granular film which show ferromagnetic property can be employed. Specifically, an anisotropic magneto-resistance effect film (AMR film) and a giant magneto-resistance effect film (GMR film) such as a spin valve film, an artificial lattice film, and a granular film can be cited. Among these ferromagnetic materials, since, by stacking, particularly, Co or Co alloy with an anti-ferromagnetic material film 3 comprising RMn alloy, an exchange coupling film 2 exceedingly high in the blocking temperature can be obtained, thus it is favorably employed.

The exchange coupling film 2 of the above described example can be effectively used for elimination of Barkhausen noise of the ferromagnetic material film in a magneto-resistance effect element (MR element) or for fixation of magnetization of the ferromagnetic material film in an artificial lattice film or a spin valve film. However, usage of the anti-ferromagnetic material film and the exchange coupling film 2 using that is not limited to the MR element, but is also applicable in various ways, for example, such as in regulation of magnetic anisotropy in various magnetic circuit such as a magnetic yoke consisting of the ferromagnetic material film.

Next, an example of a magneto-resistance effect element (MR element) using the above described exchange coupling film will be explained with reference to FIG. 2 through FIG. 5. Although the MR element is effective in, for example, a reproducing element of a magnetic head for magnetic recording apparatus such as a HDD, or a magnetic field detecting sensor, it is also applicable effectively in, other than that described above, a magnetic memory apparatus such as a magneto-resistance effect memory (MRAM= Magnetoresistive random-access memory).

Figure 2:
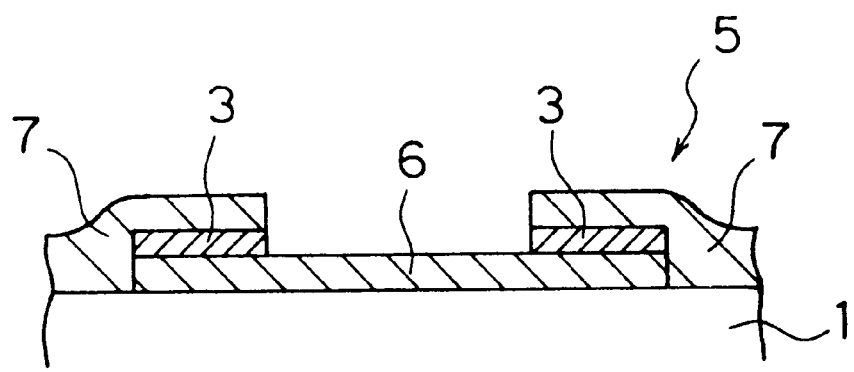
FIG. 2 is a cross sectional view showing a structure of one example of a magneto-resistance effect element of the present invention.

FIG. 2 is one example structure of an AMR element 5 in which the exchange coupling film of the present invention is employed for elimination of the Barkhausen noise of the anisotropic magneto-resistance effect film (AMR film). The AMR element 5 comprises as the ferromagnetic material film an AMR film 6 consisting of a ferromagnetic material such as $Ni_{80}Fe_{20}$ and the like which electric resistance varies depending on an angle formed between a direction of electric current and a magnetic moment of the magnetic film. On both edge portions of the AMR film 6, anti-ferromagnetic material films 3 are stacked, respectively. These AMR film 6 and anti-ferromagnetic material film 3 constitute an exchange coupling film, and, to the AMR film 6, a magnetic bias is invested from the anti-ferromagnetic material film 3.

In addition, on both edge portions of the AMR film 6, a pair of electrodes 7 consisting of Cu, Ag, Au, Al, or alloys formed therebetween and electrically connected to the AMR film through the anti-ferromagnetic material film 3 are formed, and, through this pair of electrodes 7, an electric current (sense current) is provided to the AMR film 6. These of an AMR film 6, anti-ferromagnetic material films 3, and a pair of electrodes 7 constitute an AMR element 5. Further, the electrodes 7 can be formed so as to form a direct contact with the AMR film 6. Still further, these constituent elements are formed on one main surface of the substrate 1 consisting of, for example, $Al_2O_3.TiC$.

Figure 3:
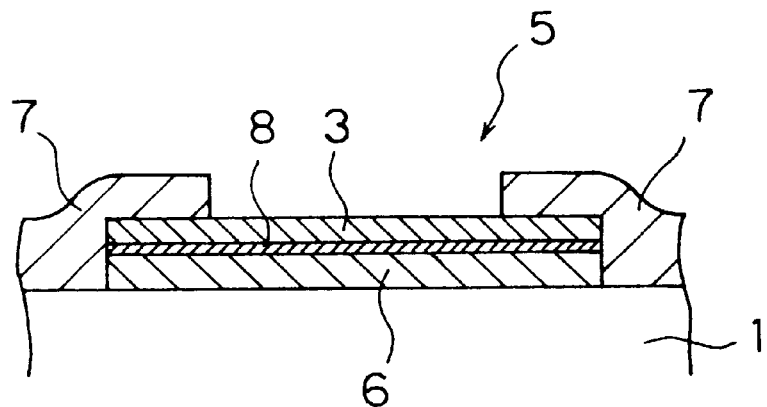
FIG. 3 is a cross sectional view showing a modification of the magneto-resistance effect element shown in FIG. 2.

In the above described AMR element 5, by utilizing an exchange coupling between the AMR film 6 and the anti-ferromagnetic material film 3, magnetic bias is given to the AMR film 6 to control magnetic domain, and, by controlling the magnetic domain of the AMR film 6, occurrence of the Barkhausen noise is suppressed. Investment of the magnetic bias to the AMR film 6 through the anti-ferromagnetic material film 3 can be, as shown in FIG. 3, implemented by forming the anti-ferromagnetic material film 3 on the AMR film 6 in a stacked manner through an exchange bias magnetic field controlling film 8, thereby forming exchange coupling between these AMR film 6 and the anti-ferromagnetic material film 3 through the exchange bias magnetic field control film 8. In this case, a pair of electrodes 7 can be partially stacked at both edge portions of the anti-ferromagnetic material film 3.

When the anti-ferromagnetic material film of the present invention is used in investment of the magnetic bias to the AMR film 6 of the AMR element 5, since, as described above, fundamental performance of the anti-ferromagnetic material film 3 comprising of RMn alloy and the like can be fully and stably exhibited and since the exchange coupling force sufficient at room temperature and high temperature region can be stably obtained, the occurrence of the Barkhausen noise can be suppressed with reproducibility under various conditions.

Figure 4:
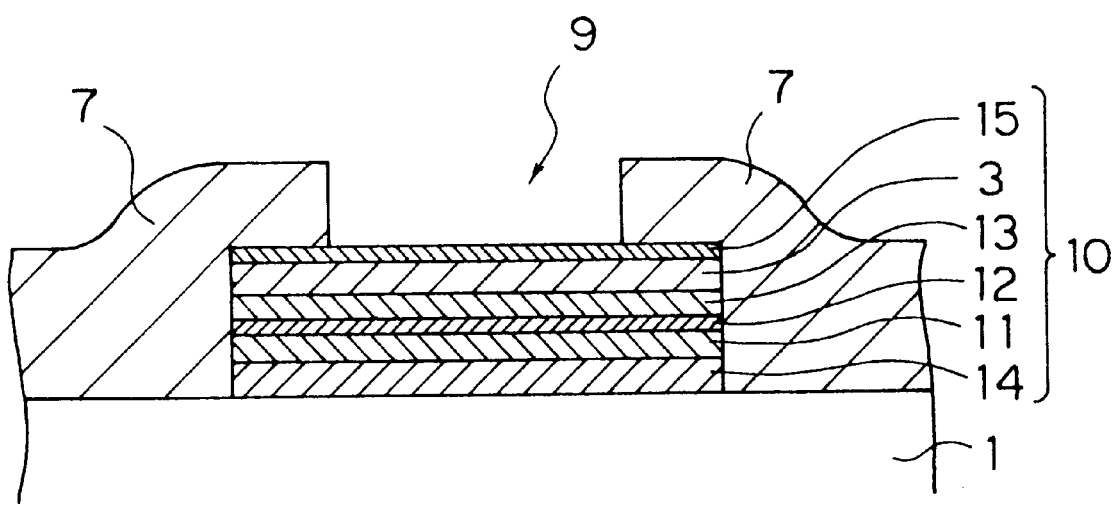
FIG. 4 is a cross sectional view showing a structure of another example of a magneto-resistance effect element of the present invention.

FIG. 4 shows one construction example of a GMR element 9 manufactured by applying the anti-ferromagnetic material film of the present invention for fixing magnetically the ferromagnetic layer of a giant magneto-resistance effect film (GMR film). The GMR element 9 comprises, as the ferromagnetic material film, a multi-layered film of sandwich structure formed between a ferromagnetic layer/a non-magnetic layer/a ferromagnetic layer, a multi-layered film formed by stacking a spin valve film, in which electric resistivity varies depending on an angle formed between magnetizations of these ferromagnetic material films, or the ferromagnetic layer and the non-magnetic layer, and a GMR film 10 comprising an artificial lattice film displaying GMR.

A GMR element 9 shown in FIG. 4 comprises a GMR film (spin valve GMR film) 10 comprising a spin valve film. This spin valve GMR film 10 possesses a sandwich structure formed of a ferromagnetic material layer 11/a non-magnetic layer 12/a ferromagnetic layer 13, wherein on the upper side ferromagnetic layer 13 an anti-ferromagnetic material film 3 is laminated. The ferromagnetic layer 13 and the anti-ferromagnetic material film 3 constitute an exchange coupling film. The upper side ferromagnetic layer 13 is a so-called pinning layer which is magnetically fixed through an exchange coupling force with the anti-ferromagnetic material film 3. Besides, the lower side ferromagnetic layer 11 is a so-called free layer varying in a magnetization direction according to a signal magnetic field (external magnetic field) from a magnetic recording medium and the like. In addition, in the spin valve GMR film 10, the pinning layer and the free layer can be upside-down in their positions.

The ferromagnetic layer 11 can be formed on a magnetic substrate layer (or non-magnetic substrate layer) 14 depending on necessity. The magnetic substrate layer 14 can be formed of one kind of magnetic film or a laminate film of different kinds of magnetic films. Specifically, as a magnetic substrate layer 14, an amorphous type soft magnetic material or a soft magnetic material of a face-centered cubic crystal structure, such as NiFe alloy, NiFeCo alloy, and magnetic alloys added thereto various kinds of additional elements can be used. Further, in the figure, numeral 15 shows a protective film consisting of Ta and the like be formed depending on necessity.

On both edge portions of the spin valve GMR film 10, a pair of electrodes 7 are formed of Cu, Ag, Au, Al, or alloys formed therebetween and from a pair of electrodes an electric current (sense electric current) is provided to the spin valve GMR film 10. From these of the spin valve GMR film 10 and a pair of electrodes 7, the GMR element 9 is constituted. In addition, the electrodes 7 can be formed underneath the spin valve GMR film 10.

In a spin valve type GMR element 9, when an anti-ferromagnetic material film of the present invention is used for fixation of magnetization of one side ferromagnetic layer, since, as described above, primary performance of an anti-ferromagnetic material film 3 consisting of such as an RMn alloy can be fully and stably exhibited, and exchange coupling force sufficient at room temperature and high temperature region can be obtained stably, the magnetic fixation state of the pinning layer becomes stable and strong, thus, excellent GMR characteristics can be obtained stably.

Next, one example of a reproducing MR head and a magnetic recording/reproducing combination head using thereof in which an MR element (a GMR element, for example) of the above described example is applied will be described with reference to FIG. 5 to FIG. 6.

Figure 5:
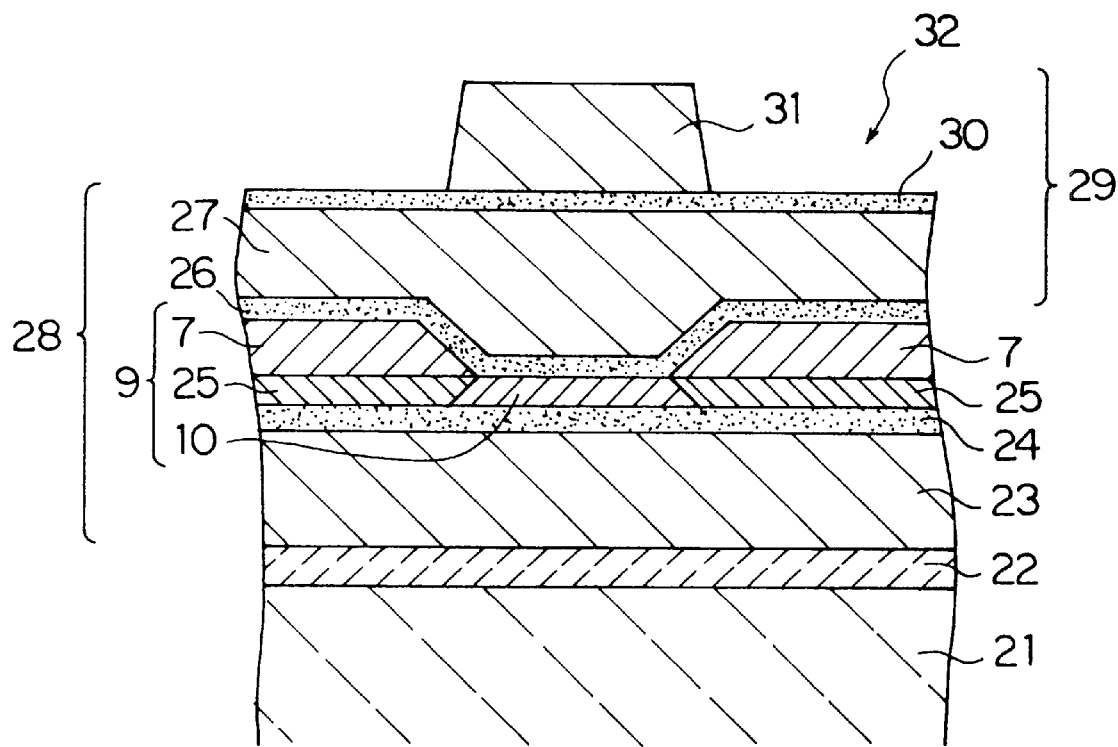
FIG. 5 is a cross sectional view showing a structure of one example of a magnetic head using a magneto-resistance effect element of the present invention.

As shown in FIG. 5, on one main surface of a substrate 21 composed of $Al_2O_3.TiC$ and the like, through an insulating layer 22 consisting of $Al_2O_3$ and the like, a lower side magnetic shield layer 23 composed of a soft magnetic material is formed.

On the lower side magnetic shield layer 23, through a lower side reproducing magnetic gap 24 composed of a non-magnetic insulating film such as $Al_2O_3$, a GMR element 9 shown, for example, in FIG. 4 is formed.

Numeral 25 in the figure is a hard magnetic film (hard bias film) consisting of CoPt alloy and the like which invest bias magnetic field to the spin valve GMR film 10. The bias film can be constituted by the anti-ferromagnetic material film. A pair of electrodes 7 are formed on the hard magnetic film 25, and the spin valve GMR film 10 and a pair of electrodes 7 are electrically connected through the hard magnetic film 25. The hard magnetic film 25 investing the bias magnetic field to the spin valve GMR film 10, as shown in FIG. 6, can be formed beforehand on a lower side reproducing magnetic gap 24. In this case, on the lower side reproducing magnetic gap 24 including a pair of hard magnetic films 25, the spin valve GMR film 10 is formed, and thereon a pair of electrodes 7 are formed.

On the GMR element 9, an upper side reproducing magnetic gap 26 consisting of a non-magnetic insulating film such as $Al_2O_3$ is formed. Further, thereon an upper side magnetic shield layer 27 consisting of a soft magnetic material is formed, thereby a shield type GMR head 28 functioning as a reproducing head is constituted.

On a reproducing magnetic head consisting of the shield type GMR head 28, a recording magnetic head comprising an induction type thin film magnetic head 29 is formed. An upper side magnetic shield layer 27 of the shield type GMR head 28 concurrently works as a lower recording magnetic pole of the induction type thin film magnetic head 29. On the lower recording magnetic pole 27 which concurrently works as the upper side magnetic shield layer, through a recording magnetic gap 30 consisting of a non-magnetic insulating film such as $Al_2O_3$, an upper recording magnetic pole 31 patterned in a predetermined shape is formed.

With a reproducing head comprising such a shield type GMR head 28 and a recording head comprising an induction type thin film magnetic head 29, a magnetic recording/reproducing combination head 32 is constituted. In addition, the upper recording magnetic pole 31 can be formed by embedding inside a trench which is disposed on an insulating layer consisting of $SiO_2$ and the like formed on a recording magnetic gap, thereby a narrow track can be realized with reproducibility. The magnetic recording/reproducing combination head 32, by shape forming or separating operation utilizing, for example, a semiconductor process, can be formed.

In the shield type GMR head 28 of the magnetic recording/reproducing combination head described in the above example, a large exchange coupling force and a high blocking temperature which an exchange coupling film formed between the anti-ferromagnetic material film, which comprises RMn alloy, and the ferromagnetic material film show, can be fully utilized. In addition, even when an AMR element of the present invention is applied in a reproducing magnetic head, a magnetic recording/reproducing combination head can be similarly formed.

Next, concrete embodiments of the present invention and their evaluated results will be explained.

Embodiment 1, 2

As raw material powder of R elements, Ir powder, Pt powder, Rh powder, Ni powder, Pd powder, Ru powder, Au powder of each average particle diameter of 20 $\mu$m are prepared. Besides, for Mn raw material powder, Mn powder of an average particle diameter of 40 $\mu$m is prepared. After respective raw material powder is compounded according to the compound ratio (raw material composition) shown in table 1 respectively, to prevent contamination from metal impurities, mixing operation is executed with a ball mill made of Nylon. Respective mixing operation is executed for 48 hours under a reduced pressure.

These respective mixed powder are sintered under a pressure of 25 MPa using a vacuum hot press apparatus. The hot press operation is executed at 1,150° C. immediate below the melting temperature of Mn.

Constituent phases of respective obtained target material is analysed within its plane with an XRD and an EPMA method. As a result, every target material is confirmed to include alloy phase and compound phase formed between the R elements and Mn. Main alloy phase and main compound phase of the respective target material are shown in Table 1. Further, the grain diameter of Mn existing as a single phase is investigated with a SEM method. The grain size of Mn in each target material is 30 $\mu$m at the maximum and 20 $\mu$m at the average.

Then, after processing the above described respective target material into a target shape, a backing plate is soldered thereto to produce a sputtering target respectively. After setting the respective sputtering target in a high frequency magnetron sputtering apparatus, an anti-ferromagnetic material film is formed in a film in a magnetic field without heating the substrate. The anti-ferromagnetic material film is formed in a film so as to form an exchange coupling film.

Specifically, on a Si (100) substrate covered with a thermally oxidized film, a Ta substrate film of a thickness of 5 nm, a Co based ferromagnetic material film of a thickness of 5 nm, and anti-ferromagnetic material films of various compositions of a thickness of 15 nm are sequentially formed.

Thus, each exchange coupling film is produced. At this stage, the exchange bias force is measured. However, concerning a $Ni_{50}Mn_{50}$ film and a $Pd_{50}Mn_{50}$ film, since, without heat treatment, the exchange coupling force can not be obtained, their exchange bias force are measured after heat treatment at condition of 270° C. and 5 hours. Obtained values are shown in Table 1 (embodiment 1).

As another embodiment of the present invention (embodiment 2), with the identical processes except employing Mn powder of an average particle diameter of 150 $\mu$m, sputtering targets of the same composition are produced, respectively. Each sputtering target according to embodiment 2 is evaluated as identical with the embodiment 1. The results are concurrently shown in Table 1 (embodiment 2).

Then, the constituent phases of each sputtering target according to the embodiment 2 are analysed within its plane with an XRD method and an EPMA method. There showed up identical alloy phases or compound phases with the embodiment 1, but, when measured with a SEM method, the grain size of Mn turned out to be 100 $\mu$m at maximum, 40 $\mu$m at minimum, and 80 $\mu$m at average.

Further, as a comparative example of the present invention, by using each raw material powder employed in the embodiment 1 and embodiment 2 and by processing identically with the embodiment 1 and embodiment 2 except that the hot pressing temperature is set at a temperature (1,000° C.) where any alloy phases and compound phases are not formed, each sputtering target of identical composition is produced, respectively. When each sputtering target according to comparative example 1 is analysed within its plane as to the constituent phase with an XRD method and an EPMA method, there is no alloy phase or compound phase.

TABLE 1

| Sample No. | Raw Material Composition (at.%) | Target Composition (at.%) | Primary Alloy Phase | Primary Compound Phase | Exchange Bias Force (× 80 A/m) Embodiment 1 | Embodiment 2 | Comparative Example 1 |
|---|---|---|---|---|---|---|---|
| 1 | Ir22, Mn78 | $Ir_{22}Mn_{78}$ | IrMn alloy | $IrMn_3$ | 250 | 180 | 170 |
| 2 | Pt18, Mn82 | $Pt_{18}Mn_{82}$ | PtMn alloy | $PtMn_3$ | 190 | 140 | 140 |
| 3 | Rh20, Mn80 | $Rh_{20}Mn_{80}$ | RhMn alloy | $RhMn_3$ | 210 | 150 | 140 |
| 4 | Ir20, Mn80 | $Ir_{20}Mn_{80}$ | IrMn alloy | $IrMn_3$ | 260 | 180 | 170 |
| 5 | Ni40, Mn60 | $Ni_{40}Mn_{60}$ | NiMn alloy | NiMn | 250 | 180 | 180 |
| 6 | Pd40, Mn60 | $Pd_{40}Mn_{60}$ | PdMn alloy | PdMn | 180 | 130 | 120 |
| 7 | Pt20, Pd20, Mn60 | $Pt_{20}Pd_{20}Mn_{60}$ | PtPdMn alloy | (Pt,Pd)Mn compound | 250 | 220 | 210 |
| 8 | Pt20, Ru20, Mn60 | $Pt_{20}Ru_{20}Mn_{60}$ | PtRuMn alloy | (Pt,Ru)Mn compound | 230 | 200 | 180 |
| 9 | P20, Ru20, Mn60 | $Pd_{20}Ru_{20}Mn_{60}$ | PdRuMn alloy | (Pd,Ru)Mn compound | 200 | 170 | 160 |
| 10 | Au10, Pt10, Mn80 | $Au_{10}Pt_{10}Mn_{80}$ | AuPtMn alloy | (Au,Pt)Mn compound | 180 | 160 | 160 |
| 11 | Rh10, Ru10, Mn80 | $Rh_{10}Ru_{10}Mn_{80}$ | RhRuMn alloy | (Rh,Ru)Mn compound | 240 | 210 | 200 |
| 12 | Rh10, Pt10, Mn80 | $Rh_{10}Pt_{10}Mn_{80}$ | RhPtMn alloy | (Rh,Pt)Mn compound | 240 | 200 | 210 |

As evident from Table 1, all of exchange coupling films which include the anti-ferromagnetic material films formed in films using the sputtering target of the present invention displayed large exchange coupling forces, thus, exellent performance is displayed. On the contrary, in the case of exchange coupling film formed employing each sputtering target of comparative example, only small exchange coupling force can be obtained.

Next, a composition variation accompanying lapse of sputtering time of each anti-ferromagnetic material film according to the above described embodiment 1 is investigated. The composition variation is investigated by measuring the compositions of the anti-ferromagnetic material film of sputtering initial stage (after 1 hour) and the anti-ferromagnetic material film formed after 20 hours sputtering with an X-ray fluorescence analysis method. Their results are shown in Table 2.

TABLE 2

| | Sample No. | Target Composition (at. %) | Deviation of Film Composition(at. %) After 1 hour | After 20 hours |
|---|---|---|---|---|
| Embodiment 1 | 1 | $Ir_{22}Mn_{78}$ | $Ir_{22}Mn_{78}$ | $Ir_{21.8}Mn_{78.2}$ |
| | 2 | $Pt_{18}Mn_{82}$ | $Pt_{18}Mn_{82}$ | $Pt_{18.3}Mn_{81.7}$ |
| | 3 | $Rh_{20}Mn_{80}$ | $Rh_{20}Mn_{80}$ | $Rh_{19.5}Mn_{80.5}$ |
| | 4 | $Ir_{20}Mn_{80}$ | $Ir_{20}Mn_{80}$ | $Ir_{20.3}Mn_{79.7}$ |
| | 5 | $Ni_{40}Mn_{60}$ | $Ni_{50}Mn_{50}$ | $Ni_{49.5}Mn_{50.5}$ |
| | 6 | $Pd_{40}Mn_{60}$ | $Pd_{50}Mn_{50}$ | $Pd_{49.5}Mn_{50.5}$ |

TABLE 2-continued

| | Sample No. | Target Composition (at. %) | Deviation of Film Composition(at. %) After 1 hour | After 20 hours |
|---|---|---|---|---|
| Embodiment 2 | 1 | $Ir_{22}Mn_{78}$ | $Ir_{25}Mn_{75}$ | $Ir_{30}Mn_{70}$ |
| Comparative Example 1 | 1 | $Ir_{22}Mn_{78}$ | $Ir_{21}Mn_{79}$ | $Ir_{27}Mn_{73}$ |

Further, as to an anti-ferromagnetic material film (IrMn alloy film) formed into a film by employing a sputtering target according to specimen 1 of the embodiment 1 and an anti-ferromagnetic material film (IrMn alloy film) formed into a film using a sputtering target of the comparative example 1, the composition distribution within a film plane is investigated. The measurement were executed on a Si substrate at a central point (A point) and other four points (B, C, D, E point) separated 3 cm from the central point toward periphery along diagonals. The obtained results are shown in Table 3.

TABLE 3

| | Target Composition (at. %) | Ir Composition at Each Point within a Substrate (at. %) A point | B point | C point | D point | E point |
|---|---|---|---|---|---|---|
| Embodiment 1 | $Ir_{22}Mn_{78}$ | 22.0 | 21.8 | 21.7 | 21.6 | 21.5 |
| Comparative Example 1 | $Ir_{22}Mn_{78}$ | 25.0 | 23.8 | 23.5 | 24.1 | 23.4 |

As evident from Table 2 and Table 3, an anti-ferromagnetic material film formed using a sputtering target of the present invention displays a small composition deviation accompanying the lapse of sputtering time and is excellent in homogeneity of composition distribution within a substrate plane.

Embodiment 3

With an identical method as the embodiment 1, IrMn targets, RhMn targets, PtMn targets of various compositions are produced respectively. With each from IrMn target, RhMn target, PtMn target of these various compositions, an exchange coupling film is manufactured with identical manner as the embodiment 1. Exchange coupling force of each exchange coupling film is measured, and composition dependency of the exchange coupling force is investigated. The result is shown in FIG. 7.

Figure 7:
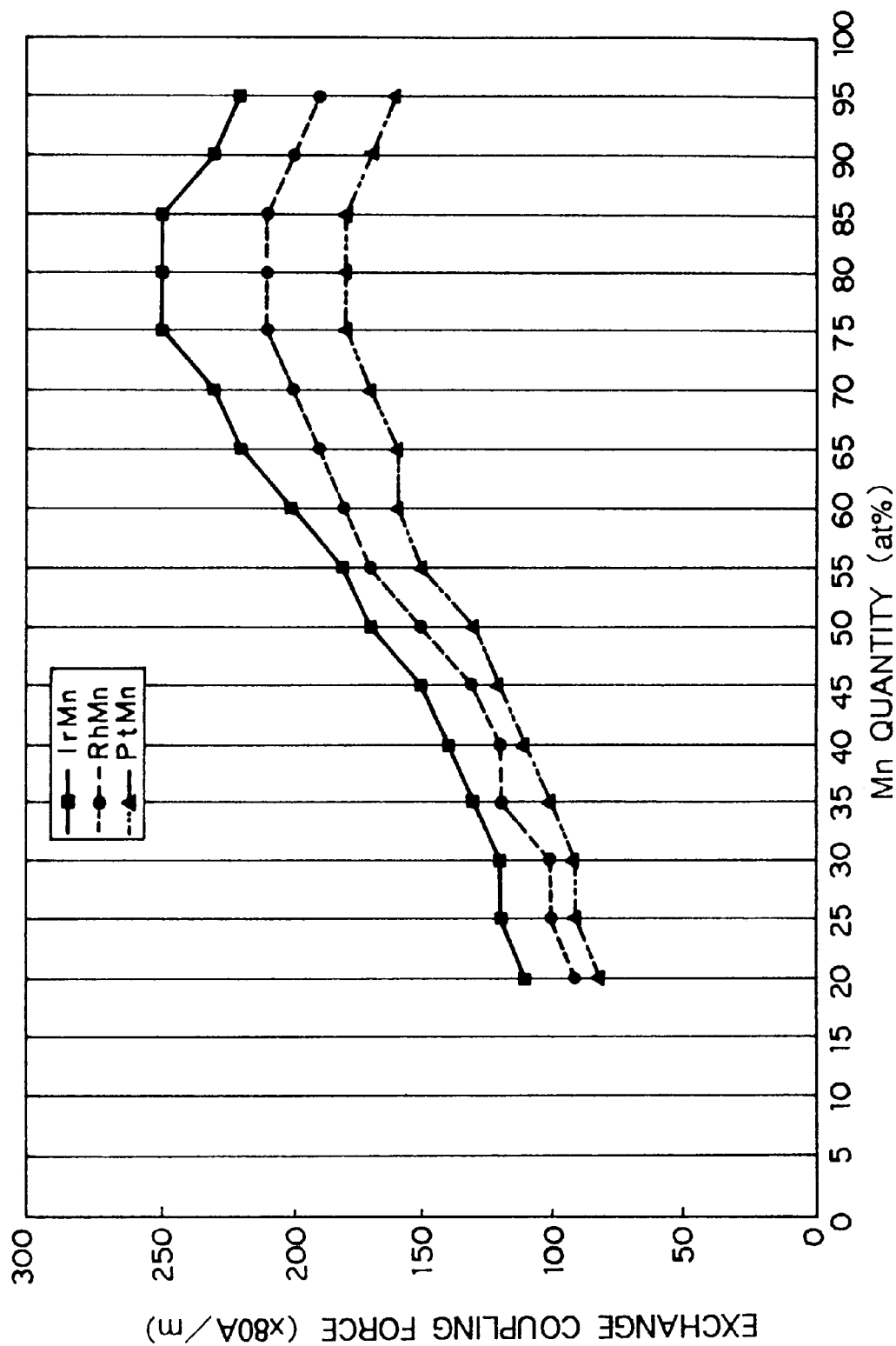
FIG. 7 is a graph showing composition dependency of exchange coupling force of anti-ferromagnetic material films formed in films using sputtering targets formed according to embodiment 3 of the present invention.

As evident from FIG. 7, it is understood that each exchange coupling film comprising an anti-ferromagnetic material film formed into a film using a sputtering target of the present invention displays sufficient exchange coupling force in a broad composition range.

Embodiment 4

With an identical process as embodiment 1 except that Mn powder possessing average particle diameter shown in Table 4 is used, a sputtering target respectively different in the particle diameter of Mn as shown in Table 4 is manufactured.

Oxygen content of obtained each sputtering target is measured and, after forming into a film as identical manner as embodiment 1, the exchange bias force is measured. Further, with the identical method as that of the embodiment 1, the composition distribution within a film plane is investigated. The results are shown in Table 4.

TABLE 4

| Sample No. | Target Composition (at. %) | Average Particle Diameter of Raw Material Mn Powder (μm) | Grain size of Mn Particle in Target (μm) | | Ir Composition at Each Point within a Substrate (at. %) | | | | | Exchange Bias Force (× 80 A/m) |
|---|---|---|---|---|---|---|---|---|---|---|
| | | | average | maximum | A point | B point | C point | D point | E point | |
| 1 | Ir$_{22}$Mn$_{78}$ | 10 | <10 | <10 | 22.0 | 21.7 | 21.6 | 21.7 | 21.5 | 200 |
| 2 | Ir$_{22}$Mn$_{78}$ | 40 | 20 | 30 | 22.0 | 21.8 | 21.6 | 21.5 | 21.6 | 250 |
| 3 | Ir$_{22}$Mn$_{78}$ | 80 | 30 | 40 | 22.3 | 22.0 | 22.2 | 21.8 | 22.0 | 250 |
| 4 | Ir$_{22}$Mn$_{78}$ | 150 | 80 | 130 | 25.0 | 23.8 | 23.5 | 24.1 | 23.4 | 240 |

As evident from Table 4, the film compositions formed into films employing the Mn grains large in the maximum size and average size display large variations in their substrate planes, thereby it can be understood that these targets cause problems in massproduction. On the contrary, the films obtained by using the sputtering targets small in their maximum grain size and average grain size do not show problem as to the composition variation in their substrate planes, but their exchange bias forces tend to decrease.

Embodiment 5

Each sputtering target shown in Table 5 is manufactured employing the sintering method identical with the embodiment 1 and with, other than that, the melting method, respectively. Processability and gas component concentrations (included gas concentrations of both of oxygen and carbon) of each sputtering target are investigated. Further, after forming the exchange coupling film with the identical way as the embodiment 1, the exchange bias force and the blocking temperature of each exchange coupling film are measured. These results are shown in Table 5. In addition, the constituent phases of each sputtering target according to embodiment 3 are identical with those of the embodiment 1.

Besides, as a comparative example 2 to the present invention, each sputtering target is manufactured with the sintering method identical with that of the above described embodiments except that raw material powder relatively rich in carbon impurity quantity is employed and mixing operation is executed in air. Further, each sputtering target is manufactured with the melting method identical with that of the above described embodiments except that raw material powder relatively rich in carbon impurity is employed and degassing time during melting is set short than those of the embodiments. As to each sputtering target according to the comparative example, the processability, gas component concentrations, and the exchange bias force of the exchange coupling film are measured. These results are also shown in Table 5.

TABLE 5

| | Target Composition (at. %) | Manufacturing Method | Gas Component Concentration (wt. %) | | Exchange Bias Force (× 80 A/m) | Blocking Temperature (° C.) |
|---|---|---|---|---|---|---|
| | | | oxygen | carbon | | |
| Embodiment 5 | Ir$_{22}$Mn$_{78}$ | Sintering Method | 0.600 | 0.200 | 250 | 290 |
| | Ir$_{22}$Mn$_{78}$ | Melting Method | 0.028 | 0.005 | 250 | 280 |
| | Pt$_{18}$Mn$_{82}$ | Sintering Method | 0.580 | 0.160 | 180 | 390 |
| | Pt$_{18}$Mn$_{82}$ | Melting Method | 0.025 | 0.005 | 180 | 400 |
| Comparative Example 2 | Ir$_{22}$Mn$_{78}$ | Sintering Method | 3.120 | 1.010 | 180 | 210 |
| | Ir$_{22}$Mn$_{78}$ | Melting Method | 1.580 | 0.980 | 180 | 200 |
| | Pt$_{18}$Mn$_{82}$ | Sintering Method | 2.140 | 1.220 | 130 | 350 |
| | Pt$_{18}$Mn$_{82}$ | Melting Method | 1.760 | 0.790 | 130 | 360 |

As evident from Table 5, by employing the sputtering targets of the present invention in which both of the oxygen content and the carbon content are reduced, performance of the exchange coupling films comprising the anti-ferromagnetic material films formed using thereof can be enhanced.

Embodiment 6

Figure 6:
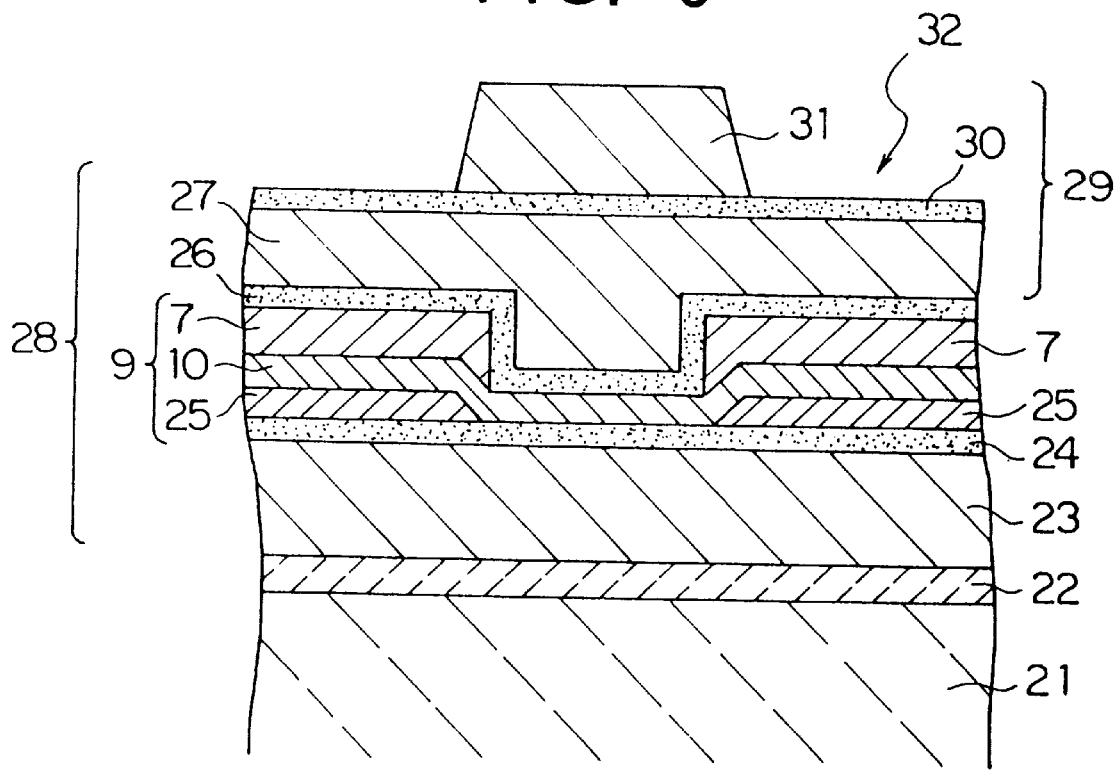
FIG. 6 is a cross sectional view showing one modification example of a magnetic head shown in FIG. 5.

In this embodiment, with an exchange coupling film formed between an anti-ferromagnetic material film, which is formed into a film using an identical sputtering target as the example 1, and a ferromagnetic material film, respective GMR element comprising respective spin valve film shown in FIG. 4 or FIG. 6 and magnetic heads using thereof are manufactured.

In the spin valve GMR film 10, Co$_{90}$Fe$_{10}$ films of respective thickness of 3 nm, 2 nm, are used for ferromagnetic layers 11, 13 respectively, and Cu film of a thickness of 3 nm for the non-magnetic layer 12. Each Co$_{90}$Fe$_{10}$ film now formed into a film comprised a crystal structure of a face-centered cubic crystal system. For an anti-ferromagnetic material film 3, each anti-ferromagnetic material film (film thickness of 8 nm) produced according to the above described embodiment 1 or embodiment 3 is used.

In addition, for the magnetic substrate layer 14, a laminate film formed between a Co$_{88}$Zr$_5$Nb$_7$ film of a thickness of 10 nm and a Ni$_{80}$Fe$_{20}$ film of a thickness of 2 nm is used, for the electrode 7, a Cu film of a thickness of 0.1 nm is used, and, for the protective film 15, a Ta film of a thickness of 20 nm is used, respectively. Further, for the hard magnetic layer 25, a $Co_{83}Pt_{17}$ film of a thickness of 40 nm is used.

Film formation of the ferromagnetic layers 11, 13, the non-magnetic layer 12, and the anti-ferromagnetic material film 3 is executed in a magnetic field, further, by heat treating them in a magnetic field thereafter, a uniaxial magnetic anisotropy is given to the exchange coupling between the ferromagnetic layer 13 and the anti-ferromagnetic material film 3. In addition, the magnetic substrate layer 14 is also heat treated after film formation in the magnetic field and is invested a uniaxial magnetic anisotropy, and, by magnetizing the hard magnetic layer 25, the uniaxial magnetic anisotropy is further enhanced. Finally, by processing the element according to a conventional semiconductor process, a GMR element and a magnetic head using thereof are produced.

While applying an external magnetic field from outside to the GMR element manufactured according to the present embodiment, their magnetic field response performance are checked. Output stable at equal level or more than that of a GMR element in which a γ-FeMn alloy is used in the anti-ferromagnetic material film can be obtained. In addition, no Barkhausen noise due to magnetic wall shift is detected. Furthermore, compared with the GMR element in which γ-FeMn alloy is used for the anti-ferromagnetic material film, due to excellent corrosion resistivity of the anti-ferromagnetic material film, in addition, due to high blocking temperature of the exchange coupling film and large exchange coupling force, a highly sensitive GMR element, in which stable output can be realized, can be manufactured with high yield.

Further, in a magnetic head comprising such a GMR element, when an IrMn based anti-ferromagnetic material film highly resistant in corrosion is employed, 0.1 μm depth, which was impossible due to corrosion when FeMn is employed, was made possible, thus, a large reproducing output can be obtained.

Embodiment 7

Sputtering targets are manufactured with an identical process as the embodiment 1 using IrMn alloy and IrMn alloys respectively added with one additional element from Ge, Si, Ga, Al, Zn, Hf, Zr, Ti.

With each sputtering target thus obtained, after manufacturing each exchange coupling film sample with an identical method as the embodiment 1, corrosion resistivity test is executed on each sample. In the corrosion resistivity test, after immersing above obtained each sample in water for 24 hours, incidence of corrosion pit was measured. The results are shown in FIG. 8.

In addition, as comparative example to the present invention, samples employing anti-ferromagnetic material films comprising of $(Fe_{0.5}Mn_{0.5})_{89.5}Ir_{10.5}$ alloy and $Fe_{50}Mn_{50}$ alloy instead of IrMn alloy are exposed to an identical corrosion resistivity test. The results are shown in FIG. 8.

Figure 8:
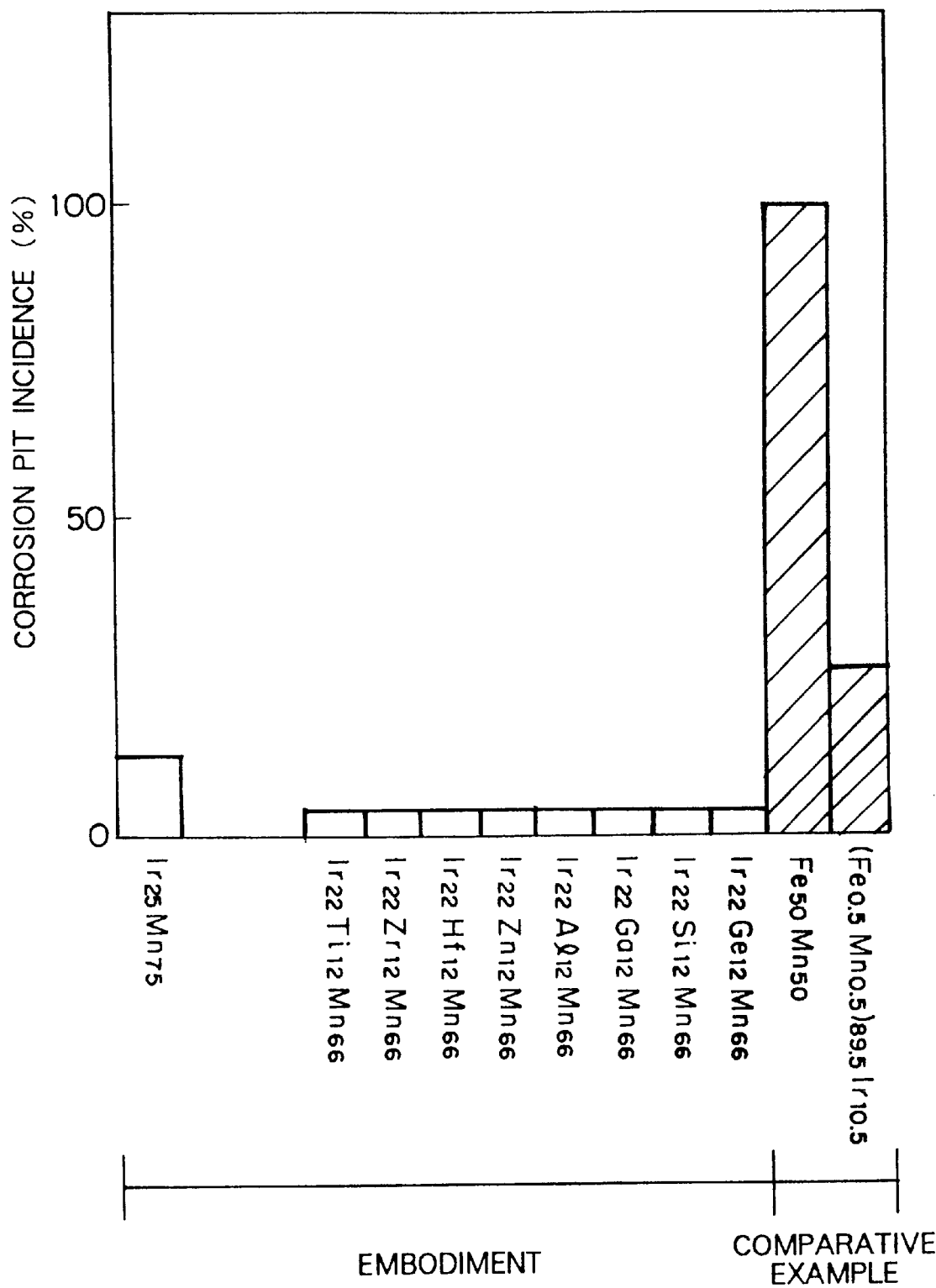
FIG. 8 is a graph showing results of corrosion resistivity test of the exchange coupling film samples formed into films using the sputtering targets obtained according to embodiment 7 of the present invention.

As evident from the results of the corrosion resistivity test shown in FIG. 8, by addition of other elements to the IrMn alloy, it is found that incidence of the corrosion pit are reduced.

Figure 9:
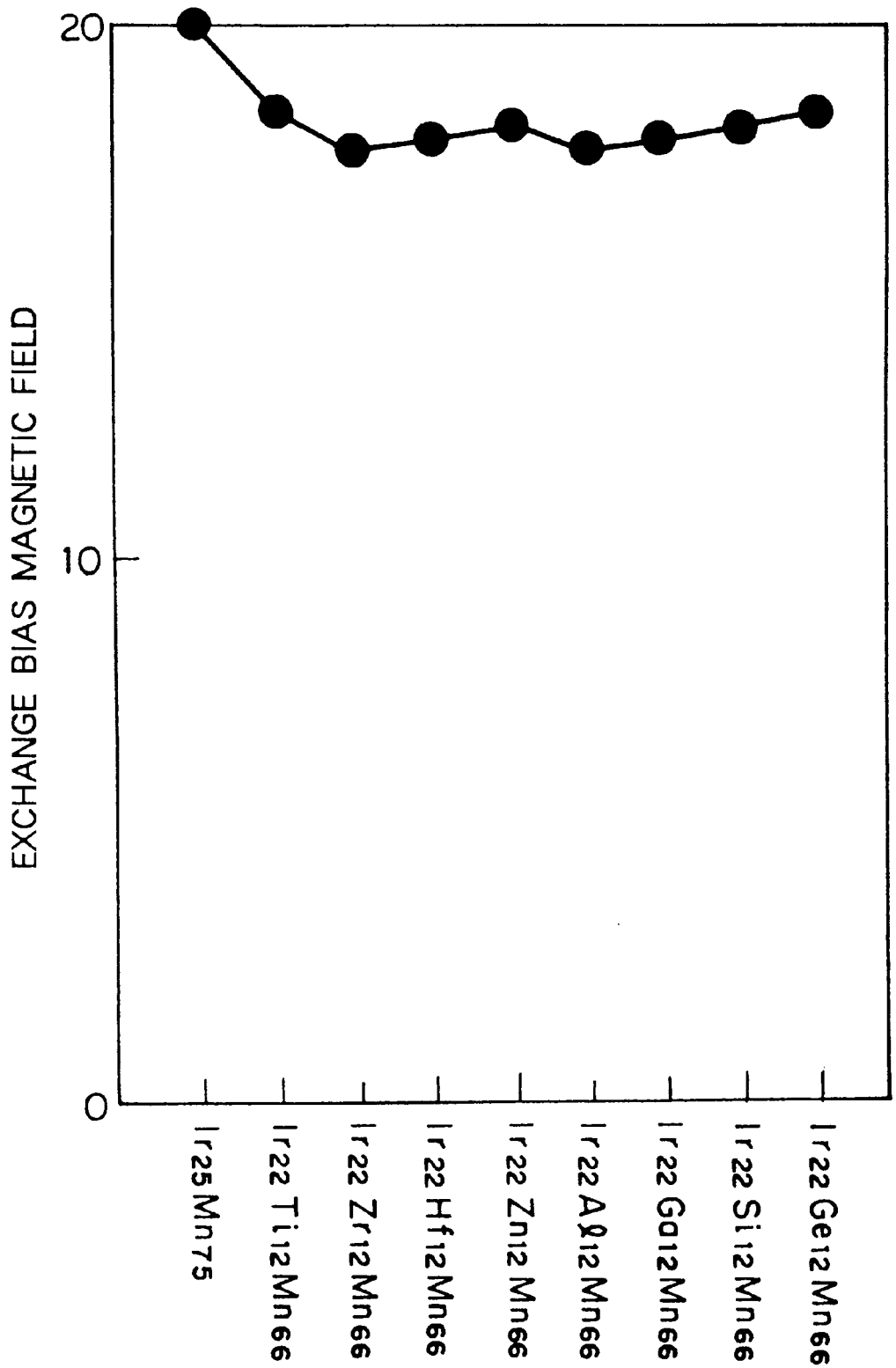
FIG. 9 is a graph showing measured results of exchange bias forces of the exchange coupling film samples formed into films using the sputtering targets formed according to embodiment 7 of the present invention.
Figure 10:
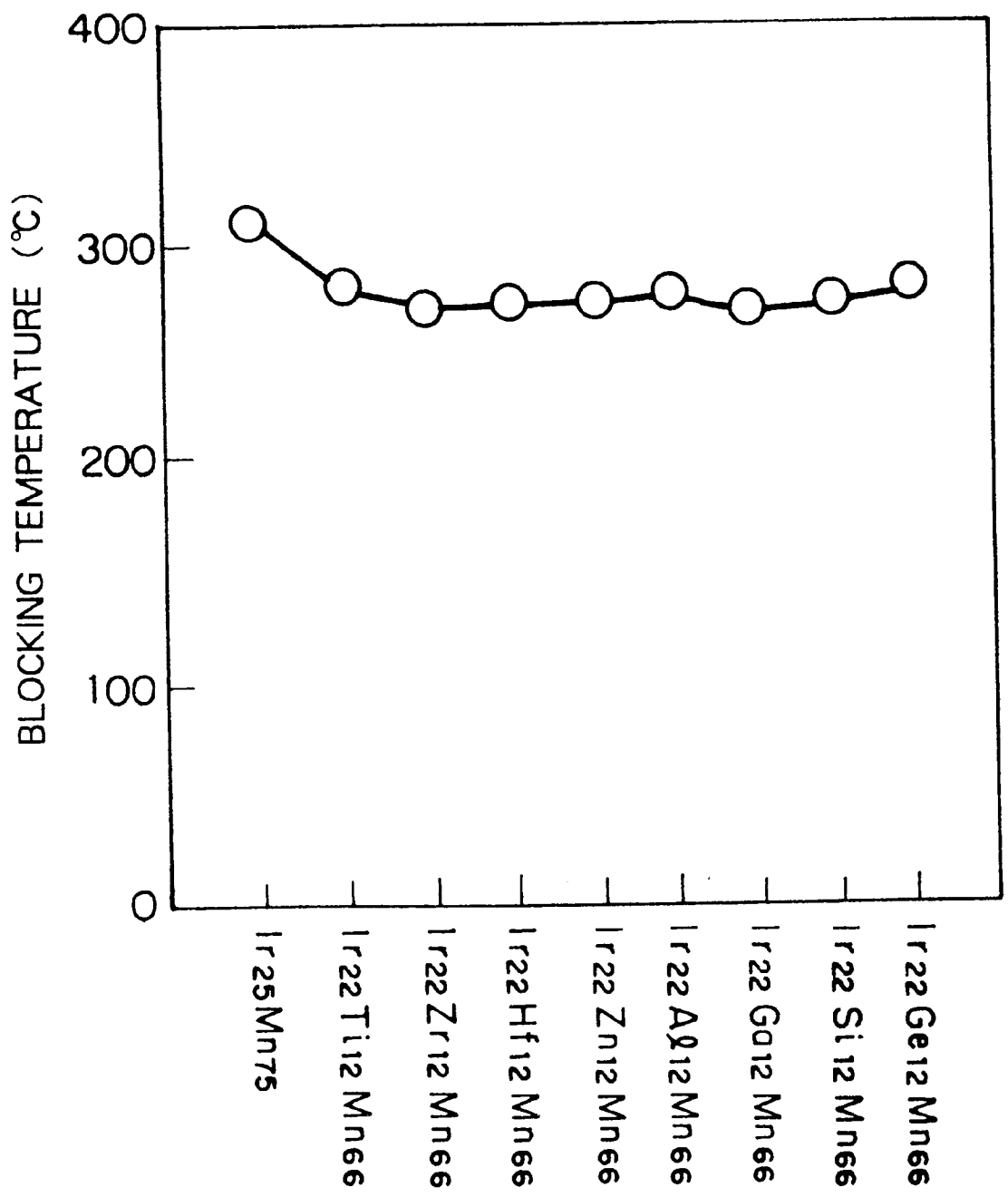
FIG. 10 is a graph showing measured results of blocking temperatures of the exchange coupling film samples formed into films using the sputtering targets obtained according to embodiment 7 of the present invention.

In addition, in FIG. 9 and FIG. 10, measured results of the exchange bias magnetic field and the blocking temperature of each sample are shown. As evident from FIG. 9 and FIG. 10, both of the exchange bias magnetic field and the blocking temperature are enhanced.

According to a sputtering target of the present invention, an anti-ferromagnetic material film comprising a Mn alloy excellent in corrosion resistivity and thermal performance can be stabilized in its film composition and film quality. Therefore, an anti-ferromagnetic material film, in which sufficient exchange coupling force can be obtained stably, can be realized with reproducibility. Such an anti-ferromagnetic material film of the present invention can be applied effectively in a magneto-resistance effect element and the like. Further, according to a magneto-resistance effect element employing an anti-ferromagnetic material film of the present invention, stable performance as well as output can be obtained with reproducibility.

What is claimed is:

1. A sputtering target consisting essentially of Mn and at least one kind of R element selected from the group consisting of Ni, Pd, Pt, Co, Rh, Ir, V, Nb, Ta, Cu, Ag, Ru, Os, Cr, Mo, W, and Re, wherein the sputtering target comprises at least one member selected from the group consisting of an alloy phase and a compound phase formed between the R element and Mn as at least a part of the target texture.

2. The sputtering target as set forth in claim 1, wherein an oxygen content of the sputtering target is 1 weight % or less.

3. The sputtering target as set forth in claim 1, wherein an oxygen content of the sputtering target is 0.7 weight % or less.

4. The sputtering target as set forth in claim 1, wherein an oxygen content of the sputtering target is 0.1 weight % or less.

5. The sputtering target as set forth in claim 1, wherein an oxygen content of the sputtering target is 0.025 weight % or less.

6. The sputtering target as set forth in claim 1, wherein the maximum diameter of the Mn grain, other than the Mn constituting the alloy phase and the compound phase, is 50 μm or less and wherein the average grain diameter of the Mn is in the range of from 10 to 40 μm.

7. The sputtering target as set forth in claim 1, wherein a carbon content of the sputtering target is 0.3 weight % or less.

8. The sputtering target as set forth in claim 1, wherein a carbon content of the sputtering target is 0.2 weight % or less.

9. The sputtering target as set forth in claim 1, wherein a carbon content of the sputtering target is 0.01 weight % or less.

10. The sputtering target as set forth in claim 1, wherein a carbon content of the sputtering target is 0.005 weight % or less.

11. The sputtering target as set forth in claim 1, wherein the R element is at least one selected from the group consisting of Ir, Pt, and Pd.

12. The sputtering target as set forth in claim 1, wherein the relative density of the sputtering target is 90% or more.

13. The sputtering target as set forth in claim 12, wherein the sputtering target is obtained by sintering.

14. The sputtering target as set forth in claim 12, wherein the sputtering target is obtained by a melting method.

15. The sputtering target as set forth in claim 1, wherein the sputtering target contains 30 atomic % or more of Mn.

16. The sputtering target as set forth in claim 1, further comprising at least one element selected from the group consisting of Be, Ti, Zr, Hf, Zn, Cd, Al, Ga, In, Si, Ge, Sn, and N.

17. A sputtering target consisting essentially of Mn and at least one kind of R element selected from the group consisting of Ni, Pd, Pt, Co, Rh, Ir, V, Nb, Ta, Cu, Ag, Ru, Os, Cr, Mo, W, and Re, wherein an oxygen content of the sputtering target is 1 weight % or less.

18. The sputtering target as set forth in claim 17, wherein an oxygen content of the sputtering target is 0.7 weight % or less.

19. The sputtering target as set forth in claim 17, wherein an oxygen content of the sputtering target is 0.1 weight % or less.

20. The sputtering target as set forth in claim 17, wherein an oxygen content of the sputtering target is 0.025 weight % or less.

21. The sputtering target as set forth in claim 17, wherein a carbon content of the sputtering target is 0.3 weight % or less.

22. The sputtering target as set forth in claim 17, wherein a carbon content of the sputtering target is 0.2 weight % or less.

23. The sputtering target as set forth in claim 17, wherein a carbon content of the sputtering target is 0.01 weight % or less.

24. The sputtering target as set forth in claim 17, wherein a carbon content of the sputtering target is 0.005 weight % or less.

25. The sputtering target as set forth in claim 17, wherein the R element is at least one selected from the group consisting of Ir, Pt, and Pd.

26. The sputtering target as set forth in claim 17, wherein the relative density of the sputtering target is 90% or more.

27. The sputtering target as set forth in claim 26, wherein the sputtering target is obtained by sintering.

28. The sputtering target as set forth in claim 26, wherein the sputtering target is obtained by a melting method.

29. The sputtering target as set forth in claim 17, wherein the sputtering target contains 30 atomic % or more of Mn.

30. The sputtering target as set forth in claim 17, further comprising at least one element selected from the group consisting of Be, Ti, Zr, Hf, Zn, Cd, Al, Ga, In, Si, Ge, Sn, and N.

31. An anti-ferromagnetic material film formed into a film by a sputtering method with the sputtering target as set forth in claim 1.

32. A magneto-resistance effect element comprising an anti-ferromagnetic material film as set forth in claim 31.

33. A magneto-resistance effect element comprising the anti-ferromagnetic material film as set forth in claim 31 and a ferromagnetic material film exchange-coupled with the anti-ferromagnetic material film.

34. A magneto-resistance effect element comprising the anti-ferromagnetic material film as set forth in claim 31, a first ferromagnetic layer exchange-coupled with the anti-ferromagnetic material film, and a second ferromagnetic layer stacked on the first ferromagnetic layer through a non-magnetic layer.

35. The magneto-resistance effect element as set forth in claim 32, wherein the anti-ferromagnetic material film has a thickness in the range of 3 to 15 nm.

36. The magneto-resistance effect element as set forth in claim 32, wherein the anti-ferromagnetic material film has a thickness of 10 nm or less.

37. The magneto-resistance effect element as set forth in claim 33, wherein the ferromagnetic material film has a thickness in the range of 1 to 3 nm.

38. An anti-ferromagnetic material film formed into a film by a sputtering method with the sputtering target as set forth in claim 17.

39. A magneto-resistance effect element comprising an anti-ferromagnetic material film as set forth in claim 38.

40. A magneto-resistance effect element comprising the anti-ferromagnetic material film as set forth in claim 38 and a ferromagnetic material film exchange-coupled with the anti-ferromagnetic material film.

41. A magneto-resistance effect element comprising the anti-ferromagnetic material film as set forth in claim 38, a first ferromagnetic layer exchange-coupled with the anti-ferromagnetic material film, and a second ferromagnetic layer stacked on the first ferromagnetic layer through a non-magnetic layer.

42. The magneto-resistance effect element as set forth in claim 39, wherein the anti-ferromagnetic material film has a thickness in the range of 3 to 15 nm.

43. The magneto-resistance effect element as set forth in claim 39, wherein the anti-ferromagnetic material film has a thickness of 10 nm or less.

44. The magneto-resistance effect element as set forth in claim 40, wherein the ferromagnetic material film has a thickness in the range of 1 to 3 nm.

45. A magnetic head comprising a magneto-resistance effect element as set forth in claim 32.

46. A magnetic recording apparatus comprising a magnetic head as set forth in claim 45.

47. The magnetic recording apparatus as set forth in claim 46, wherein the magnetic recording apparatus is an HDD recording apparatus.

48. A magnetic memory apparatus comprising a magneto-resistance effect element as set forth in claim 32.

49. A magnetic memory apparatus comprising a magneto-resistance effect element as set forth in claim 39.

50. The magnetic memory apparatus as set forth in claim 48, wherein the magnetic memory is a magneto-resistance effect memory.

51. The magnetic memory apparatus as set forth in claim 49, wherein the magnetic memory is a magneto-resistance effect memory.

52. A magnetic sensor comprising a magneto-resistance effect element as set forth in claim 32.

53. A magnetic sensor comprising a magneto-resistance effect element as set forth in claim 39.

54. A magnetic head comprising a magneto-resistance effect element as set forth in claim 38.

55. A magnetic recording apparatus comprising a magnetic head as set forth in claim 54.

56. The magnetic recording apparatus as set forth in claim 55, wherein the magnetic recording apparatus is an HDD recording apparatus.

* * * * *

UNITED STATES PATENT AND TRADEMARK OFFICE
CERTIFICATE OF CORRECTION

PATENT NO. : 6,165,607
DATED : December 26, 2000
INVENTOR(S) : Takashi Yamanobe, et al.

Page 1 of 1

It is certified that error appears in the above-identified patent and that said Letters Patent is hereby corrected as shown below:

Column 2,
Line 7, replace "5,315,468" with -- 5,315,468 --.

Column 5,
Line 6, replace "consisting substantially of Mn" with -- consisting substantially of Mn --.

Column 6,
Line 44, replace "other remaining Mn than that forms" with -- remaining Mn other that that forming --.

Column 7,
Lines 22-23, replace "defects such as cracks tend, to occur" with -- defects such as cracks tend to occur --.
Line 46, replace "is" with -- are --.

Column 8,
Line 27, replace "mixing method" with -- mixing methods --.

Column 17,
Line 21, replace "massproduction" with -- mass production --.

Signed and Sealed this

Thirtieth Day of October, 2001

Attest:

*Attesting Officer*

NICHOLAS P. GODICI
*Acting Director of the United States Patent and Trademark Office*